United States Patent
Blake et al.

(10) Patent No.: US 7,723,977 B2
(45) Date of Patent: May 25, 2010

(54) OPTICAL SENSOR ARRANGEMENT FOR ELECTRICAL SWITCHGEAR

(75) Inventors: James Norman Blake, Paradise Valley, AZ (US); Yves Doin, Meylan (FR); Cataldo Diaferia, Voreppe (FR); Andrzej Klimek, Surrey (CA); Frédéric Leclerc, Grenoble (FR); Farnoosh Rahmatian, Vancouver (CA)

(73) Assignees: Siemens AG, Munich (DE); NXTPhase T&D Corporation, Vancouver, British Columbia (CA)

( * ) Notice: Subject to any disclaimer, the term of this patent is extended or adjusted under 35 U.S.C. 154(b) by 178 days.

(21) Appl. No.: 11/659,043

(22) PCT Filed: Mar. 15, 2006

(86) PCT No.: PCT/EP2006/060755

§ 371 (c)(1),
(2), (4) Date: Jul. 21, 2007

(87) PCT Pub. No.: WO2006/103174

PCT Pub. Date: Oct. 5, 2006

(65) Prior Publication Data

US 2008/0303510 A1  Dec. 11, 2008

(30) Foreign Application Priority Data

Mar. 30, 2005 (EP) .................................. 05102486

(51) Int. Cl.
*G01R 31/00* (2006.01)
*G01R 19/00* (2006.01)
(52) U.S. Cl. ........................................ 324/96; 324/107
(58) Field of Classification Search ....................... None
See application file for complete search history.

(56) References Cited

U.S. PATENT DOCUMENTS

| 5,136,236 | A | * | 8/1992 | Bohnert et al. | ................. 324/96 |
| 5,635,829 | A | * | 6/1997 | Hamada | ....................... 324/96 |
| 6,016,053 | A | * | 1/2000 | Yakymyshyn et al. | ......... 324/96 |
| 6,057,678 | A | * | 5/2000 | Tagiri et al. | .................... 324/96 |
| 6,166,816 | A | * | 12/2000 | Blake | .......................... 356/478 |

(Continued)

FOREIGN PATENT DOCUMENTS

CH            694 193 A5      8/2004

(Continued)

*Primary Examiner*—Jermele M Hollington
(74) *Attorney, Agent, or Firm*—Laurence A. Greenberg; Werner H. Stemer; Ralph E. Locher

(57) ABSTRACT

An optical sensor configuration contains an optical current sensor and/or an optical voltage sensor. The sensor configuration further contains a first and a second hollow member, preferably ring shaped profiles, which are together disposed to form a hollow section. The sensor configuration further includes an optical fiber of the current sensor disposed in an annular groove, the groove being disposed at the boundary surface between the first hollow member and the second hollow member, and/or an optical fiber of the voltage sensor is disposed in a recess of the second hollow member. The first hollow member has an annular recess into which the second hollow member is disposed whereas the first hollow member is an L-shaped or U-shaped ring with two legs and the recess is formed between the two legs.

83 Claims, 3 Drawing Sheets

U.S. PATENT DOCUMENTS

| | | | |
|---|---|---|---|
| 6,356,351 B1 * | 3/2002 | Blake | 356/483 |
| 7,057,792 B2 * | 6/2006 | Kadogawa et al. | 324/96 |
| 7,633,285 B2 * | 12/2009 | Rahmatian et al. | 324/107 |
| 2003/0117125 A1 * | 6/2003 | Rahmatian et al. | 324/96 |
| 2003/0117126 A1 * | 6/2003 | Rahmatian | 324/96 |
| 2004/0020529 A1 * | 2/2004 | Schutt et al. | 136/245 |
| 2004/0041083 A1 * | 3/2004 | Kadogawa et al. | 250/214 R |
| 2006/0103371 A1 * | 5/2006 | Manz | 324/158.1 |
| 2008/0186012 A1 * | 8/2008 | Rahmatian et al. | 324/107 |
| 2009/0001258 A1 * | 1/2009 | Horimoto et al. | 250/227.14 |

FOREIGN PATENT DOCUMENTS

| | | |
|---|---|---|
| DE | 43 14 821 A1 | 11/1994 |
| DE | 196 34 251 A1 | 3/1998 |
| EP | 0 650 236 A1 | 4/1995 |
| JP | 10-66247 | 3/1998 |

* cited by examiner

OPTICAL SENSOR ARRANGEMENT FOR ELECTRICAL SWITCHGEAR

BACKGROUND OF THE INVENTION

Field of the Invention

The invention is pertaining to an optical sensor arrangement comprising an optical current sensor and/or an optical voltage sensor, the sensor arrangement comprises a first and a second hollow member, preferably ring shaped profiles, which are arranged to form together a hollow section, the sensor arrangement further comprises an optical fibre of the current sensor arranged in an annular groove, said groove being arranged at the boundary surface between first hollow member and second hollow member, and/or an optical fibre of the voltage sensor arranged in a recess of the second hollow member; as well as to the use of such a sensor arrangement in gas insulated switchgear and a method for assembly and/or retrofitting an electrical switchgear.

In electrical switchgear, it is necessary to measure the current flowing through the switchgear and voltage between two potentials at the switchgear, e.g. the high voltage potential of a current-carrying conductor and ground. In gas insulated switchgear (GIS) the electrical conductors are arranged inside a gas filled enclosure which makes it difficult to arrange current and voltage sensors at the conductors. Because compactness of the switchgear and a space and cost saving design is always a design goal of such switchgear, the utilized sensor arrangements have to be compact, robust and easy accessible. There are different sensor types known for this task from prior art, e.g. current and voltage transformer or optical current and voltage sensor.

CH 694 193 A5 shows a module comprising a well-known current transformer. The module is flanged to the openings of an electrical switchgear. Because the current transformer requires a certain space, the modules have a great overall length, which increases the overall size of the switchgear. DE 43 14 821 A1 discloses a current transformer, which is integrated in the enclosure of the gas insulated switchgear. But such an arrangement increases the overall length of the switchgear.

Known optical sensor arrangements are often arranged remote from the switchgear. To this end, e.g. an electrical connection is made from the sensor arrangement to a high voltage busbar of the switchgear. From DE 196 34 251 A1 an optical voltage sensor is known which is arranged in a cap flanged onto a flange of an opening of a gas insulated switchgear enclosure. Although such an arrangement is compact an extra opening in the switchgear enclosure and extra electrical connections from the electrical conductors to the sensor arrangement are required. Moreover, such an arrangement does not provide for a current transformer.

U.S. Pat. No. 5,136,236 shows an optical sensor arrangement comprising an optical current sensor and/or an optical voltage sensor, the sensor arrangement comprises a first (11) and a second (5) hollow member, preferably ring shaped profiles, which are arranged to form together a hollow section, the sensor arrangement further comprises an optical fibre (12) of the current sensor arranged in an annular groove, said groove being arranged at the boundary surface between first and second hollow member, and/or an optical fibre (7a) of the voltage sensor arranged in a recess (9) of the second hollow member (5).

SUMMARY OF THE INVENTION

It is one object of the invention to provide an optical current and voltage sensor arrangement for an electrical switchgear, which is more compact and which is easy to integrate in the electrical switchgear and easy accessible.

This object is solved by the invention by providing an annular recess on the first hollow member into which the second hollow member is arranged whereas the first hollow member is a L- or U-shaped ring with two legs between which the recess is formed.

Such an arrangement is especially easy and compact because current and voltage sensor are provided in one unit and because the second hollow member is arranged in a recess of the first hollow member. The arrangement can easily be preassembled and can easily be integrated into an electrical switchgear.

It is especially advantageous to form first hollow member from electrically conductive material, preferably of metal. This ensures that the metallic enclosure of the switchgear is not interrupted by the sensor arrangement when assembled together. Hence, the enclosure acts like an electromagnetic shield, which reduces or eliminates the EMC radiation. This is especially useful when the substation is equipped with sensitive digital control and instrumentation equipment. But this is also important for the safety of the staff since the metallic enclosure is always kept on the same potential, preferably ground potential. If the second hollow member is formed of electrically insulating material it is ensured that the groove is at least partly covered by an insulating material. With such an arrangement the current measurement is not influenced by induced current in the conducting first member since no current loops can develop around the groove with the optical fibre The groove extends advantageously circumferentially around the opening of the hollow section through which the current-carrying conductor is led through.

The optical fibre of the current sensor can easily be led to the groove through a bore in the first hollow member connecting the outer surface of the first hollow member with the groove. This ensures an easy assembly of the sensor arrangement.

The recess of the second hollow member is advantageously a radially extending dead end bore, which can easily be manufactured, into which at least one Pockels cell is arranged. The electric field around the conductor, which acts also in the second member, influences the Pockels cell thus enabling the measurement of the voltage by means of the effect.

To ensure gas tightness of the enclosure a seal is provided between the first and second hollow member.

The optical sensor arrangement is especially advantageously arranged between two flanges of adjacent enclosure parts of the switchgear. This allows a very simple assembly of the switchgear.

The design of the optical sensor arrangement allows that the sensor arrangement is preassembled and integrated as unit into the switchgear, which constitutes a very effective method to assemble or retrofit an switchgear.

The invention is described in the following with respect to FIGS. 1 to 3 showing in a schematic and not limiting way an inventive optical sensor arrangement and an application of the sensor arrangement in a gas insulated switchgear (GIS) device.

DESCRIPTION OF THE PREFERRED EMBODIMENTS

Figure 1:
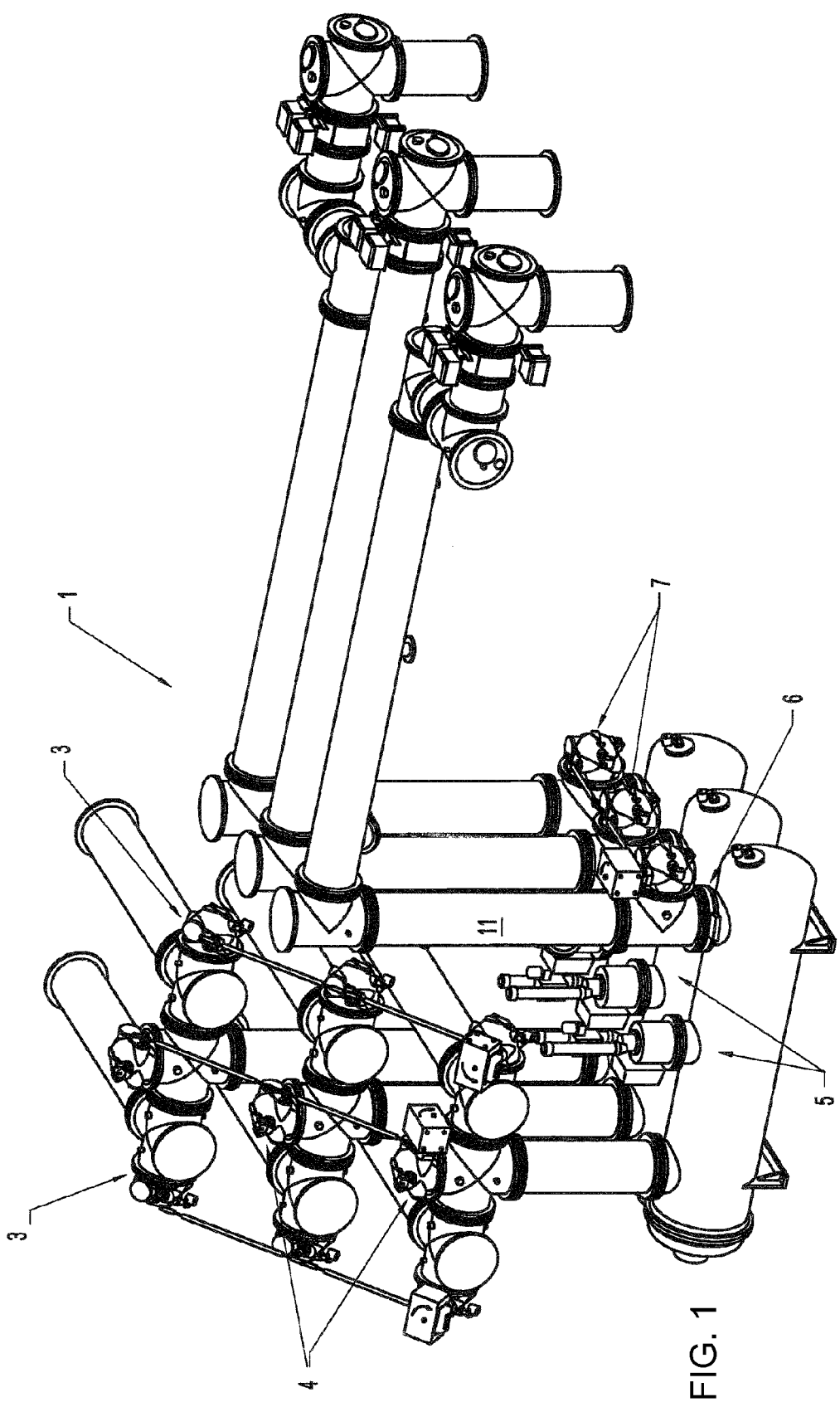
FIG. 1 depicts a typical three pole gas switchgear device.

A gas insulated switchgear (GIS) device 1 typically includes two, e.g. for each phase, disconnector switches 3, earthing switches 4, 7 and circuit breaker 5, as shown in FIG. 1, although it may as well comprise other, further and/or different devices, as is well-known. Such switchgear devices 1 are well-known from prior art and hence are not explained further. The enclosure 11 of the GIS device 1 is filled with gas, e.g. $SF_6$ gas, and includes also mechanical parts of the switches, e.g. the contacts, drive mechanism, etc., of the different switches of the switchgear 1 and also the electrical conductor 10, which is led through the switchgear 1. Into the enclosure 11 is integrated also an inventive optical sensor arrangement 6 for measuring the electrical current and voltage, as described in detail in the following.

Figure 2:
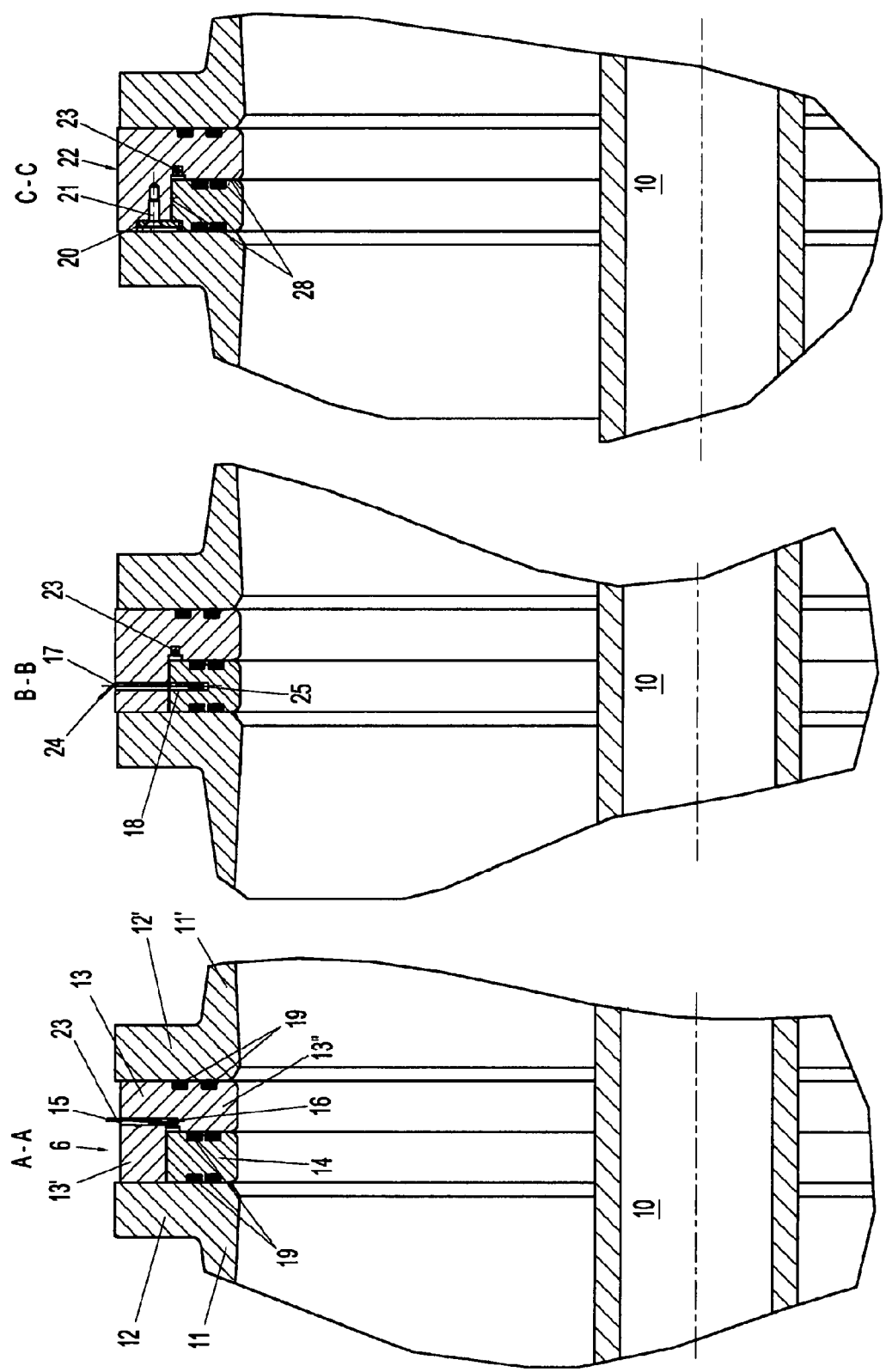
FIG. 2 shows different sectional views of an inventive optical sensor arrangement as integrated in a gas insulated switchgear device and FIG. 3 shows a top view of such an inventive optical sensor arrangement.
Figure 3:
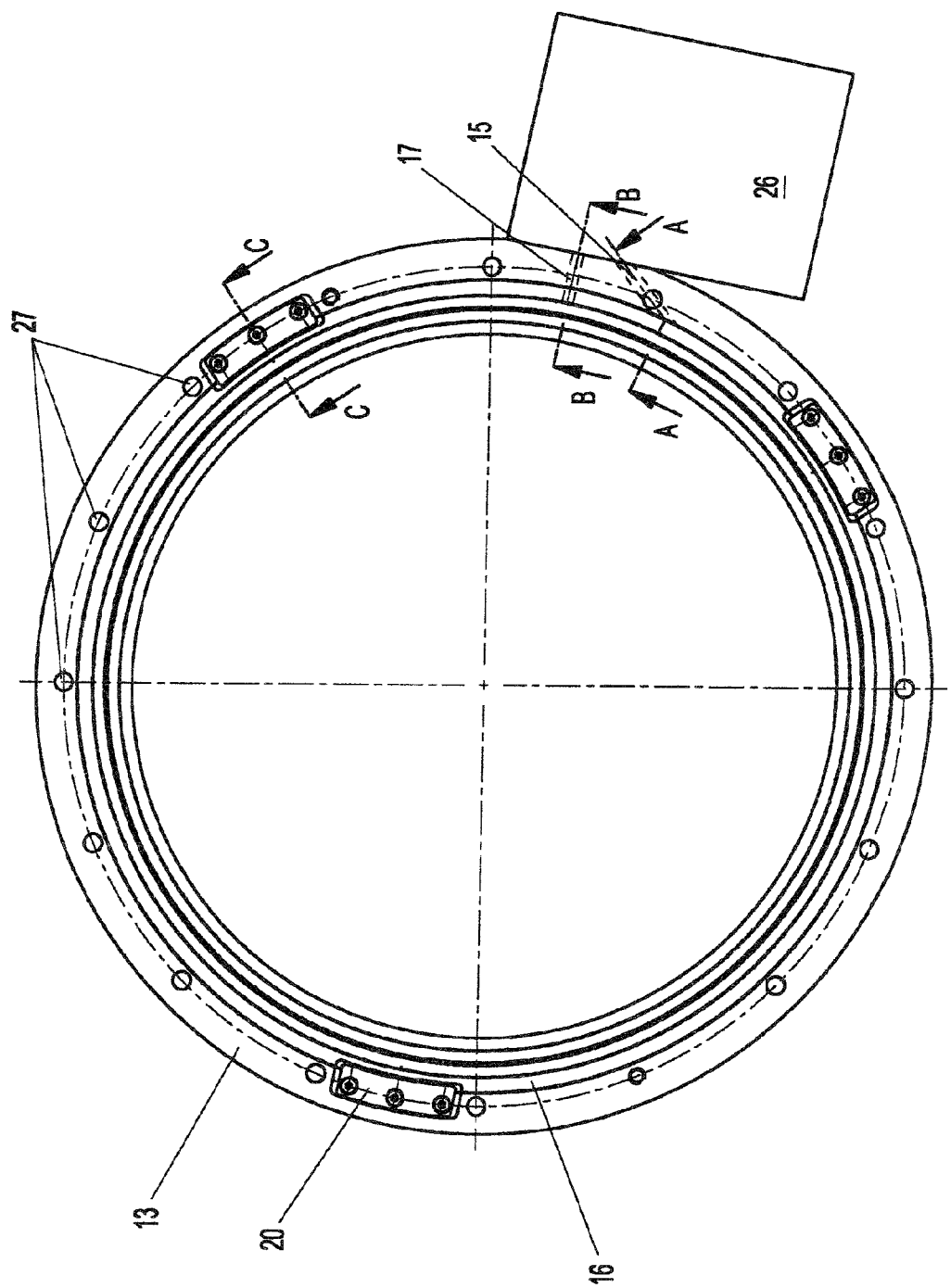

The optical sensor arrangement 6 is best shown in FIGS. 2 and 3 and is described in the following with reference to FIGS. 2 and 3. The optical sensor arrangement 6 is arranged between two flanges 12, 12' of two adjacent parts 11, 11' of the switchgear enclosure. The enclosure parts 11, 11' are connected in well-known manner by connecting means, e.g. like screws or bolts arranged in holes of the flanges 12, 12' and holes 27 of the optical sensor arrangement 6. Therefore, the optical sensor arrangement 6 forms a part of the switchgear enclosure. Consequently, the electrical conductor 10, which is arranged inside the enclosure 11, is also led through the optical sensor arrangement 6.

The optical sensor arrangement 6 comprises a first hollow member having an recess, here an electrically conductive L-shaped ring 13, preferably made from the same material as the enclosure 11, into which a second hollow member, here an electrically insulating ring 14, e.g. made of resin, is arranged. The cross-sectional profile of the annual recess in a transverse plane may have any shape, e.g. a rectangle but preferably a circle. L-shaped ring means that the ring 13 is having a cross-sectional profile in a longitudinal plane that is L-shaped. The two members are arranged next to each other to form a hollow section. In the embodiment shown, the second ring 14 is arranged in the recess formed by the two legs 13', 13" of the L-shaped ring 13. But the two hollow members 13, 14 may of course be shaped differently. The second member 14 could for example be arranged between the legs of a Y- or U-shaped first member 13, and formed from different materials. The first member 13 could be formed of any electrically conductive material, e.g. from metals or electrically conductive synthetic material, like conductive plastic or resin, but also of an electrically insulating material. The second member 14 could be formed of any suitable electrically insulating material, e.g. from synthetic material, like plastic or resin.

The annual recess of the first member 13 is arranged such that the electrically insulating member 14 is arranged on the inside of the optical sensor arrangement 6, i.e. in assembled state at the inside of the switchgear 11. Hence, the outer surface 22 of the optical sensor arrangement 6 is formed by the L-shaped ring 13. The second ring 14 in the embodiment shown is fixed in the recess by a number of plates 20, which are screwed to the L-shaped ring 13 with screws 21 thus cramping and holding the non-conductive ring 14 in position. The second member could of course be fixed to the first member by any suitable connection, e.g. positive or non-positive fit, fastened with screws or bolts, bonding, etc. In assemble state seals 19 are arranged between the L-shaped ring 13 and the flange 12' of the enclosure 11', between the electrically insulating ring 14 and the flange 12 of the enclosure 11 and between the L-shaped ring 13 and the electrically insulating ring 14 to ensure that the gas filled interior of the GIS device 1 is sealed off against the exterior and to avoid that gas leaks out from the 11.

The optical sensor arrangement 6 comprises an optical current sensor and an optical voltage sensor, although it might have as well just a current or voltage sensor.

The optical current sensor is based on the well-known Faraday effect, which uses the fact that a polarized light signal is slowed down or accelerated in the influence of a magnetic field created as current flows through an electrical conductor 10. Since this effect is well-known and often utilized in optical current sensors, it is not explained in detail. An annual groove 16 is arranged at the boundary surface 28 between first and second hollow member 13, 14, in this embodiment on an inner face of one of the legs 13', 13" of the L-shaped ring 13. Said groove 16 forms a closed loop in the ring 13, as best seen in FIG. 3. But it is of course possible to arrange the groove 16 anywhere at the boundary surface between first and second hollow member 13, 14, e.g. on the first 13 or second ring 14 or the groove 16 could be formed partially in first 13 and second hollow member 14. The groove 16 is preferably concentric with the electric conductor 10. The cross-sectional profile of the annular groove 16 in a transverse plane may have any shape, e.g. a rectangle but preferably a circle. A bore 15 connects the groove 16 with the outer surface 22 of L-shaped ring 13. The groove 16 and the first 13 or second ring 14 are arranged and dimensioned such that the groove 16 is at least partly covered by the first 13 or second ring 14 in assembled state. An optical fibre 23 is led through the bore 15 and is arranged into the groove 16 of the L-shaped ring 13 thus ferentially encircling also the electrical conductor 10 led through the GIS device 1 and the optical sensor arrangement 6 in at least one circumferential loop. The bore 15 is preferably arranged essentially tangentially, in order to reduce the stress on the optical fibre 23 during and after the assembly. Hence, the magnetic field created by the current flowing through the electric conductor 10 influences the polarization of light traveling through the optical fibre 23 on a path around the electric conductor 10. At the end of the optical fibre 23 the light can be mirrored back thus forcing the light to travel all the way back thus doubling the Faraday effect. But it would of course also be possible that the optical fibre 23 is led out from the groove 16 and the sensor arrangement 6 via the bore 15. The degree of the phase shift of two polarized light signals is evaluated and is related to the current flowing through the conductor 10.

The optical voltage sensor utilizes the well-known Pockels effect, which uses the fact that monochromatic light changes its circular polarization to an elliptical polarization as the light passes through an electro-optic crystal 25 (Pockels cell) arranged in the electric field of the electrical conductor 10. Since this effect is well-known and often utilized in optical voltage sensors, it is not explained in detail. To this end, a recess, e.g. a dead end bore 18, is provided in the second ring 14 into which at least one Pockels cell 25 is arranged. An optical fibre 24 is led to the dead end bore 18 and to the Pockels cell(s) 25 through a bore 17 in the L-shaped ring 13 aligned with the dead end bore 18. The bore 17 and the dead end bore 18 are preferably arranged radially. The electric field passes also through the electrically insulating ring 14 thereby influencing the polarization of the light signal passing through the Pockels cell(s) 25 arranged in the bore 18. The ellipticity of the light, which is evaluated, is then a measurement of the electrical field and consequently also of the voltage between the two potentials, e.g. the voltage potential of the conductor 10 and ground.

But it has to be noted that also other suitable optical current and voltage sensors might be utilized in the inventive sensor arrangement.

On the outer surface 22 of the optical sensor arrangement 6 an enclosure 26 might be mounted containing the opto-electronics needed to supply the optical current and/or voltage sensor with suitable light signals and to evaluate the light exiting the sensor arrangement. Also an interface to a digital data processor unit might be provided at the enclosure 26.

The outer surface 22 of the sensor arrangement 6 is formed by a surface of the conductive L-shaped ring 13 so that the metallic, electrical conductive, grounded enclosure 11 is not interrupted by the sensor arrangement 6, which is important for EMC reasons since EMC radiation is often bounded by certain limits. Basically the same could be achieved using ground straps or shields to electrically connect the two enclosure parts 11, 11' in case the L-shaped ring 13 is formed of electrically insulating material. In this way, a very effective protection against electromagnetic radiation is achieved with the continuous conductive enclosure 11, 22, which acts like an electromagnetic shield. This is also especially useful when the substation is equipped with sensitive digital control and instrumentation equipment. But this is also important for the safety of the staff since the metallic enclosure 11 is always kept on the same potential, preferably ground potential.

By arranging the groove 16 into which the optical current fibre 23 is arranged at the boundary surface between first and second hollow member 13, 14, whereat at least on is formed of electrically insulating material, any current loops around the optical current fibre 23 due to the current induced in the enclosure 11 by the magnetic field around the electrical conductor 10 are avoided. Thus, the induced current can not influence the current measurement.

The enclosure 11 of the GIS device 1 is typically built of a number of single modules connected to each other, as shown in FIG. 1. To this end, flanges 12 are provided on the end faces of each module for joining the single modules. Suitable sealing means are to be provided between the flanges 12 to ensure the gas tightness of the enclosure 11. The optical sensor arrangement 6 could be arranged between the flanges 12 of any two adjacent modules, also in a flanged elbow, of the electrical switchgear device 1 as described in detail above.

The design of the optical sensor arrangement 6 makes it possible that the arrangement is completely preassembled before it is integrated into the switchgear device 1. This allows a very efficient assembly or retrofitting of the switchgear because the single sensor arrangement 6 is easy handlable as single unit. The sensor arrangement 6 only needs to be arranged between two flanges 12, 12' of adjacent enclosure parts 11, 11'. To this end, the cross section of the first 13 and/or second hollow member 14 in a transverse plane is advantageously the same as a transverse cross section of the enclosure 11, preferably circular as shown in the drawings, but they could of course have any possible other cross section. All necessary supplies and connections are either integrated into the sensor arrangement 6 or can easily be connected to it, e.g. by providing respective interfaces to a digital data processing unit.

We claim:

1. An optical sensor configuration, comprising:
   an optical current sensor having an optical fiber;
   an optical voltage sensor having an optical fiber;
   a first hollow member selected from the group consisting of L-shaped rings and U-shaped rings, said first hollow member having two legs with an annular recess formed between said two legs;
   a second hollow member having a member recess formed therein and disposed in said annular recess of said first hollow member, said first and said second hollow members form together a hollow section and define at a boundary surface between said first hollow member and said second hollow member an annular groove;
   said optical fiber of said optical current sensor disposed in said annular groove; and
   said optical fiber of said voltage sensor disposed in said member recess of said second hollow member.

2. The optical sensor configuration according to claim 1, wherein:
   said first hollow member is formed from an electrically conductive material; and
   said second hollow member is formed from an electrically insulating material.

3. The optical sensor configuration according to claim 1, wherein said annular groove is formed in said first hollow member.

4. The optical sensor configuration according to claim 1, wherein said annular groove extends circumferentially around an opening of said hollow section.

5. The optical sensor configuration according to claim 1, wherein said member recess of said second hollow member extends substantially radially.

6. The optical sensor configuration according to claim 1, wherein:
   said first hollow member has a bore formed therein and an outer surface; and
   said optical fiber of said optical current sensor is led to said annular groove through said bore in said first hollow member connecting said outer surface of said first hollow member with said annular groove.

7. The optical sensor configuration according to claim 1, wherein said optical fiber of said optical voltage sensor is led through said member recess in said second hollow member.

8. The optical sensor configuration according to claim 1, wherein said optical voltage sensor includes at least one Pockels cell disposed in said member recess of said second hollow member.

9. The optical sensor configuration according to claim 1, further comprising a seal disposed between said first and second hollow members.

10. The optical sensor configuration according to claim 1, further comprising at least one clamping device fixing said second hollow member on said first hollow member.

11. The optical sensor configuration according to claim 1, wherein said first hollow member has an outer surface forming an outer surface of the optical sensor configuration.

12. The optical sensor configuration according to claim 1, wherein said first hollow member and said second hollow member each have a ring shaped profile.

13. The optical sensor configuration according to claim 2, wherein:
   said electrically conductive material is a metal; and
   said electrically insulating material is a resin.

14. The optical sensor configuration according to claim 10, wherein said clamping device includes a plate mounted, by screws, to said first hollow member.

15. The optical sensor configuration according to claim 1, wherein said annular groove is formed in said second hollow member.

16. The optical sensor configuration according to claim 1, wherein said annular groove is formed partially in said first and second hollow members.

17. The optical sensor configuration according to claim 1, wherein said two legs have inner faces and said annular groove is formed in said inner faces of said two legs of said first hollow member.

18. Electrical switchgear, comprising:
an optical sensor configuration, including:
an optical current sensor having an optical fiber;
an optical voltage sensor having an optical fiber;
a first hollow member selected from the group consisting of L-shaped rings and U-shaped rings, said first hollow member having two legs with an annular recess formed between said two legs;
a second hollow member having a member recess formed therein and disposed in said annular recess of said first hollow member, said first and said second hollow members form together a hollow section and define at a boundary surface between said first hollow member and said second hollow member an annular groove;
said optical fiber of said optical current sensor disposed in said annular groove; and
said optical fiber of said voltage sensor disposed in said member recess of said second hollow member.

19. The electrical switchgear according to claim 18, further comprising enclosures parts having flanges, said optical sensor configuration is disposed between two of said flanges of adjacent ones of said enclosures parts.

20. The electrical switchgear to claim 18, further comprising a seal disposed between said flanges and said optical sensor configuration.

21. The electrical switchgear according to claim 18, further comprising a current-carrying conductor extending through said hollow section.

22. The electrical switchgear according to claim 21, wherein said annular groove extends around said current-carrying conductor concentrically.

23. The electrical switchgear according to claim 18, wherein the electrical switchgear is gas insulated electrical switchgear.

24. A method for assembling gas insulated electrical switchgear, which comprises the steps of:
assembling an optical sensor configuration, containing:
an optical current sensor having an optical fiber;
an optical voltage sensor having an optical fiber;
a first hollow member selected from the group consisting of L-shaped rings and U-shaped rings, the first hollow member having two legs with an annular recess formed between the two legs;
a second hollow member having a member recess formed therein and disposed in the annular recess of the first hollow member, the first and second hollow members form together a hollow section and define at a boundary surface between the first hollow member and the second hollow member an annular groove;
the optical fiber of the optical current sensor disposed in the annular groove;
the optical fiber of the voltage sensor disposed in the member recess of the second hollow member; and
disposing the optical sensor configuration between two flanges of adjacent parts of an enclosure of the electrical switchgear.

25. The method according to claim 24, which further comprises disposing the optical fiber of the optical current sensor between the annular groove at the boundary surface of the first hollow member and the second hollow member.

26. The method according to claim 25, which further comprises fixing the second hollow member to the first hollow member, thereby covering at least partly the annular groove with the optical fiber of the optical current sensor.

27. The method according to claim 24, which further comprises disposing a Pockels cell in the member recess of the second hollow member and the optical fiber of the optical voltage sensor is led to the Pockels cell.

28. The method according to claim 24, which further comprises disposing a seal between the first and second hollow members and/or the first hollow member and the enclosure and/or the second hollow member and the enclosure.

29. A method for retrofitting gas insulated electrical switchgear, which comprises the steps of:
assembling an optical sensor configuration, containing:
an optical current sensor having an optical fiber;
an optical voltage sensor having an optical fiber;
a first hollow member selected from the group consisting of L-shaped rings and U-shaped rings, the first hollow member having two legs with an annular recess formed between the two legs;
a second hollow member having a member recess formed therein and disposed in the annular recess of the first hollow member, the first and second hollow members form together a hollow section and define at a boundary surface between the first hollow member and the second hollow member an annular groove;
the optical fiber of the optical current sensor disposed in the annular groove;
the optical fiber of the voltage sensor disposed in the member recess of the second hollow member; and
disposing the optical sensor configuration between two flanges of adjacent parts of an enclosure of the electrical switchgear.

30. The method according to claim 29, which further comprises disposing the optical fiber of the optical current sensor between the annular groove at the boundary surface of the first hollow member and the second hollow member.

31. The method according to claim 30, which further comprises fixing the second hollow member to the first hollow member, thereby covering at least partly the annular groove with the optical fiber of the optical current sensor.

32. The method according to claim 29, which further comprises disposing a Pockels cell in the member recess of the second hollow member and the optical fiber of the optical voltage sensor is led to the Pockels cell.

33. The method according to claim 29, which further comprises disposing a seal between the first and second hollow members and/or the first hollow member and the enclosure and/or the second hollow member and the enclosure.

34. An optical sensor configuration, comprising:
an optical current sensor having an optical fiber;
a first hollow member selected from the group consisting of L-shaped rings and U-shaped rings, said first hollow member having two legs with an annular recess formed between said two legs;
a second hollow member disposed in said annular recess of said first hollow member, said first and said second hollow members form together a hollow section and define at a boundary surface between said first hollow member and said second hollow member an annular groove; and
said optical fiber of said optical current sensor disposed in said annular groove.

35. The optical sensor configuration according to claim 34, wherein:
said first hollow member is formed from an electrically conductive material; and
said second hollow member is formed from an electrically insulating material.

36. The optical sensor configuration according to claim 34, wherein said annular groove is formed in said first hollow member.

37. The optical sensor configuration according to claim 34, wherein said annular groove extends circumferentially around an opening of said hollow section.

38. The optical sensor configuration according to claim 34, wherein:
said first hollow member has a bore formed therein and an outer surface; and
said optical fiber of said optical current sensor is led to said annular groove through said bore in said first hollow member connecting said outer surface of said first hollow member with said annular groove.

39. The optical sensor configuration according to claim 34, further comprising a seal disposed between said first and second hollow members.

40. The optical sensor configuration according to claim 34, further comprising at least one clamping device fixing said second hollow member on said first hollow member.

41. The optical sensor configuration according to claim 34, wherein said first hollow member has an outer surface forming an outer surface of the optical sensor configuration.

42. The optical sensor configuration according to claim 34, wherein said first hollow member and said second hollow member each have a ring shaped profile.

43. The optical sensor configuration according to claim 35, wherein:
said electrically conductive material is a metal; and
said electrically insulating material is a resin.

44. The optical sensor configuration according to claim 40, wherein said clamping device includes a plate mounted, by screws, to said first hollow member.

45. The optical sensor configuration according to claim 34, wherein said annular groove is formed in said second hollow member.

46. The optical sensor configuration according to claim 34, wherein said annular groove is formed partially in said first and second hollow members.

47. The optical sensor configuration according to claim 34, wherein said two legs have inner faces and said annular groove is formed in said inner faces of said two legs of said first hollow member.

48. An optical sensor configuration, comprising:
an optical voltage sensor having an optical fiber;
a first hollow member selected from the group consisting of L-shaped rings and U-shaped rings, said first hollow member having two legs with an annular recess formed between said two legs;
a second hollow member having a member recess formed therein and disposed in said annular recess of said first hollow member; and
said optical fiber of said voltage sensor disposed in said member recess of said second hollow member.

49. The optical sensor configuration according to claim 48, wherein:
said first hollow member is formed from an electrically conductive material; and
said second hollow member is formed from an electrically insulating material.

50. The optical sensor configuration according to claim 48, wherein said member recess of said second hollow member extends substantially radially.

51. The optical sensor configuration according to claim 48, wherein said optical fiber of said optical voltage sensor is led through said member recess in said second hollow member.

52. The optical sensor configuration according to claim 48, wherein said optical voltage sensor includes at least one Pockels cell disposed in said member recess of said second hollow member.

53. The optical sensor configuration according to claim 48, further comprising a seal disposed between said first and second hollow members.

54. The optical sensor configuration according to claim 48, further comprising at least one clamping device fixing said second hollow member on said first hollow member.

55. The optical sensor configuration according to claim 48, wherein said first hollow member has an outer surface forming an outer surface of the optical sensor configuration.

56. The optical sensor configuration according to claim 48, wherein said first hollow member and said second hollow member each have a ring shaped profile.

57. The optical sensor configuration according to claim 49, wherein:
said electrically conductive material is a metal; and
said electrically insulating material is a resin.

58. The optical sensor configuration according to claim 54, wherein said clamping device includes a plate mounted, by screws, to said first hollow member.

59. Electrical switchgear, comprising:
an optical sensor configuration, including:
an optical current sensor having an optical fiber;
a first hollow member selected from the group consisting of L-shaped rings and U-shaped rings, said first hollow member having two legs with an annular recess formed between said two legs;
a second hollow member disposed in said annular recess of said first hollow member, said first and said second hollow members form together a hollow section and define at a boundary surface between said first hollow member and said second hollow member an annular groove; and
said optical fiber of said optical current sensor disposed in said annular groove.

60. The electrical switchgear according to claim 59, further comprising enclosure parts having flanges, said optical sensor configuration is disposed between two of said flanges of adjacent ones of said enclosure parts.

61. The electrical switchgear to claim 59, further comprising a seal disposed between said flanges and said optical sensor configuration.

62. The electrical switchgear according to claim 59, further comprising a current-carrying conductor extending through said hollow section.

63. The electrical switchgear according to claim 62, wherein said annular groove extends around said current-carrying conductor concentrically.

64. The electrical switchgear according to claim 59, wherein the electrical switchgear is gas insulated electrical switchgear.

65. Electrical switchgear, comprising:
an optical sensor configuration, including:
an optical voltage sensor having an optical fiber;
a first hollow member selected from the group consisting of L-shaped rings and U-shaped rings, said first hollow member having two legs with an annular recess formed between said two legs;

a second hollow member having a member recess formed therein and disposed in said annular recess of said first hollow member; and said optical fiber of said voltage sensor disposed in said member recess of said second hollow member.

66. The electrical switchgear according to claim 65, further comprising enclosure parts having flanges, said optical sensor configuration is disposed between two of said flanges of adjacent ones of said enclosure parts.

67. The electrical switchgear to claim 65, further comprising a seal disposed between said flanges and said optical sensor configuration.

68. The electrical switchgear according to claim 65, further comprising a current-carrying conductor extending through said hollow section.

69. The electrical switchgear according to claim 65, wherein the electrical switchgear is gas insulated electrical switchgear.

70. A method for assembling gas insulated electrical switchgear, which comprises the steps of:
  assembling an optical sensor configuration, containing:
    an optical current sensor having an optical fiber;
    a first hollow member selected from the group consisting of L-shaped rings and U-shaped rings, the first hollow member having two legs with an annular recess formed between the two legs;
    a second hollow member disposed in the annular recess of the first hollow member, the first and second hollow members form together a hollow section and define at a boundary surface between the first hollow member and the second hollow member an annular groove;
    the optical fiber of the optical current sensor disposed in the annular groove; and
  disposing the optical sensor configuration between two flanges of adjacent parts of an enclosure of the electrical switchgear.

71. The method according to claim 70, which further comprises disposing the optical fiber of the optical current sensor between the annular groove at the boundary surface of the first hollow member and the second hollow member.

72. The method according to claim 70, which further comprises fixing the second hollow member to the first hollow member, thereby covering at least partly the annular groove with the optical fiber of the optical current sensor.

73. The method according to claim 70, which further comprises disposing a seal between the first and second hollow members and/or the first hollow member and the enclosure and/or the second hollow member and the enclosure.

74. A method for assembling gas insulated electrical switchgear, which comprises the steps of:
  assembling an optical sensor configuration, containing:
    an optical voltage sensor having an optical fiber;
    a first hollow member selected from the group consisting of L-shaped rings and U-shaped rings, the first hollow member having two legs with an annular recess formed between the two legs;
    a second hollow member having a member recess formed therein and disposed in the annular recess of the first hollow member;
    the optical fiber of the voltage sensor disposed in the member recess of the second hollow member; and
  disposing the optical sensor configuration between two flanges of adjacent parts of an enclosure of the electrical switchgear.

75. The method according to claim 74, which further comprises disposing a Pockels cell in the member recess of the second hollow member and the optical fiber of the optical voltage sensor is led to the Pockels cell.

76. The method according to claim 74, which further comprises disposing a seal between the first and second hollow members and/or the first hollow member and the enclosure and/or the second hollow member and the enclosure.

77. A method for retrofitting gas insulated electrical switchgear, which comprises the steps of:
  assembling an optical sensor configuration, containing:
    an optical current sensor having an optical fiber;
    a first hollow member selected from the group consisting of L-shaped rings and U-shaped rings, the first hollow member having two legs with an annular recess formed between the two legs;
    a second hollow member disposed in the annular recess of the first hollow member, the first and second hollow members form together a hollow section and define at a boundary surface between the first hollow member and the second hollow member an annular groove;
    the optical fiber of the optical current sensor disposed in the annular groove; and
  disposing the optical sensor configuration between two flanges of adjacent parts of an enclosure of the electrical switchgear.

78. The method according to claim 77, which further comprises disposing the optical fiber of the optical current sensor between the annular groove at the boundary surface of the first hollow member and the second hollow member.

79. The method according to claim 78, which further comprises fixing the second hollow member to the first hollow member, thereby covering at least partly the annular groove with the optical fiber of the optical current sensor.

80. The method according to claim 77, which further comprises disposing a seal between the first and second hollow members and/or the first hollow member and the enclosure and/or the second hollow member and the enclosure.

81. A method for retrofitting gas insulated electrical switchgear, which comprises the steps of:
  assembling an optical sensor configuration, containing:
    an optical voltage sensor having an optical fiber;
    a first hollow member selected from the group consisting of L-shaped rings and U-shaped rings, the first hollow member having two legs with an annular recess formed between the two legs;
    a second hollow member having a member recess formed therein and disposed in the annular recess of the first hollow member;
    the optical fiber of the voltage sensor disposed in the member recess of the second hollow member; and
  disposing the optical sensor configuration between two flanges of adjacent parts of an enclosure of the electrical switchgear.

82. The method according to claim 81, which further comprises disposing a Pockels cell in the member recess of the second hollow member and the optical fiber of the optical voltage sensor is led to the Pockels cell.

83. The method according to claim 81, which further comprises disposing a seal between the first and second hollow members and/or the first hollow member and the enclosure and/or the second hollow member and the enclosure.

* * * * *